United States Patent [19]
Donlan, Jr. et al.

[11] Patent Number: 5,565,040
[45] Date of Patent: Oct. 15, 1996

[54] METHOD FOR FLUID TREATING A SUBSTRATE

[75] Inventors: Fraser P. Donlan, Jr., Endicott; David D. Hare, Apalachin; Jeffrey D. Jones, Newark Valley; Thomas L. Miller, Vestal; Ronald J. Moore, Binghamton; Richard F. Nelson, Apalachin, all of N.Y.

[73] Assignee: International Business Machines Corporation, Armonk, N.Y.

[21] Appl. No.: 434,880

[22] Filed: May 4, 1995

Related U.S. Application Data

[60] Division of Ser. No. 928,609, Aug. 11, 1992, Pat. No. 5,483,984, which is a continuation-in-part of Ser. No. 911,610, Jul. 10, 1992, Pat. No. 5,289,639.

[51] Int. Cl.$^6$ ................ B08B 1/02; B08B 3/04
[52] U.S. Cl. ................ 134/26; 134/32; 134/34; 134/36
[58] Field of Search ................ 134/25.5, 26, 32, 134/34, 36

[56] References Cited

U.S. PATENT DOCUMENTS

| | | | |
|---|---|---|---|
| 3,947,236 | 3/1976 | Lasch, Jr. | 432/11 |
| 4,081,201 | 3/1978 | Hassan et al. | 302/2 R |
| 4,495,024 | 1/1985 | Bok | 156/646 |
| 4,521,268 | 6/1985 | Bok | 156/345 |
| 4,589,926 | 5/1986 | Holmstrand | 134/6 |
| 4,903,631 | 2/1990 | Morris | 118/63 |
| 5,007,369 | 4/1991 | Morris | 118/56 |
| 5,038,706 | 8/1991 | Morris | 118/666 |
| 5,048,549 | 9/1991 | Hethcoat | 134/122 R |
| 5,289,639 | 3/1994 | Bard et al. | 34/12 |
| 5,335,681 | 8/1994 | Schmid | 134/64 R |
| 5,378,307 | 1/1995 | Bard et al. | 156/639 |
| 5,427,627 | 6/1995 | Canestaro et al. | 134/29 |

*Primary Examiner*—Zeinab El-Arini
*Attorney, Agent, or Firm*—Bernard Tiegerman

[57] ABSTRACT

A new method for treating substrates with fluids, as well as corresponding fluid treatment apparatus. The new apparatus includes a new configuration of fluid jet injectors which substantially overcomes the problem of dragout, in which fluid impinged upon an area of a substrate is retained on that area, preventing fresh fluid from reaching the impinged area. This new configuration also avoids imposing torques on substrates, and substantially reduces the need for rollers and guides for transporting substrates.

8 Claims, 7 Drawing Sheets

METHOD FOR FLUID TREATING A SUBSTRATE

CROSS-REFERENCES TO RELATED APPLICATIONS

This is a divisional of applications: Ser. No. 07/928,609 filed on Aug. 11, 1992 now U.S. Pat. No. 5,483,984 which is a continuation-in-part of U.S. application Ser. No. 07/911,610 filed by Steven L. Bard, Jeffrey D. Jones, Robert H. Katyl, Ronald J. Moore and Oscar A. Moreno on Jul. 10, 1992, which is now U.S. Pat. No. 5,289,639.

BACKGROUND OF THE INVENTION

1. Field of the Invention

The invention pertains generally to apparatuses and methods for treating a substrate with a fluid, i.e., a liquid or a gas.

2. Description of the Related Art

In the fabrication of a variety of devices such as, for example, printed circuit boards, various fluid treatments are applied to corresponding substrates, including rinsing, drying, chemical etching and electrolytic processing. These fluid treatments have been carried out using dip tanks and various configurations of spray nozzles and fluid jet injectors.

Dip tanks, while useful, are disadvantageous because they require an undesirably large amount of time for mounting and unmounting substrates to and from racks or baskets which are submerged within the dip tanks. In addition, mass transfer within a dip tank is typically effected via diffusion, which is often too slow a process to be economic. For example, when used for substrate rinsing, a dip tank quickly becomes heavily laden with the material to be removed from a substrate, which reduces the diffusion rate within the dip tank, and thereby slows rinsing. In fact, dip tanks often become so heavily laden with removed material that further rinsing becomes impossible.

Spray nozzles are disadvantageous because, among other reasons, they serve to atomize a fluid, resulting in the evaporation of the fluid. As a consequence, undesirable chemical emissions are exacerbated and re-use of the fluid is precluded, both of which are uneconomic. In addition, because the sprays produced by spray nozzles typically fail to achieve fluid bearing action on the substrates being processed, these substrates must be transported to and from the sprays by rollers and guides positioned between the spray nozzles and the substrates. However, the presence of these rollers and guides is undesirable because, among other reasons, they produce nonuniformities in the spray action which results in, for example, nonuniform rinsing and etching. Moreover, because sprays quickly lose momentum, they often fail to achieve efficient fluid treatment of specific substrate areas, which limits processing rate and throughput. For example, sprays are often inefficient or ineffective in rinsing or drying specific substrate areas, such as the interiors of holes in substrates, because whatever fluid reaches such areas tends to be retained on or in these areas (a phenomenon called dragout), with relatively little fresh fluid reaching these areas. Moreover, sprays often re-deposit or re-position, rather than remove, debris on the substrate, which then requires the use of additional sprays. Consequently, the use of sprays often requires the use of an undesirably large amount of processing area, which is also uneconomic. While attempts have been made to orient sprays to achieve directionality and thereby overcome some of the above-mentioned disadvantages, these attempts have typically been accompanied by a torque being imposed upon the subtrate by the directed spray. This results in instabilities in the motion of the substrate, often causing jamming of the substrate in the corresponding processing equipment, resulting in damage to the substrate or equipment, which is undesirable and counterproductive.

The use of fluid jets in the fluid treatment of substrates is potentially advantageous because fluid jets exhibit directionality and therefore, in principle, are capable of overcoming the disadvantages of sprays. However, previous configurations of fluid jets have failed to overcome the problem of dragout, particularly in the case of substrates with holes. Moreover, these previous fluid jet configurations have also imposed torques on substrates, resulting in undesirable and counterproductive instabilities in the motions of substrates.

Thus, those engaged in the development of fluid treatment apparatuses and methods have long sought, thus far without success, fluid jet configurations which: (1) overcome the problem of dragout, particularly in the case of substrates with holes; (2) avoid imposing torques on substrates; and (3) substantially reduce the need for rollers and guides for transporting substrates, thereby substantially reducing the interference caused by such rollers and guides.

SUMMARY OF THE INVENTION

The invention involves a fluid treatment apparatus, and corresponding fluid treatment method, which substantially overcomes the problem of dragout, which avoids imposing torques on substrates and substantially reduces the need for rollers and guides for transporting substrates. In one embodiment of the inventive apparatus, at least one row of fluid jet injectors penetrates a surface of the apparatus, over which a substrate to be processed is transported via rollers positioned at the entrance edge and exit edge of the apparatus surface. The substrate is transported in a direction which is substantially parallel to an axis associated with the apparatus surface, extending from the entrance edge to the exit edge, and the row of fluid jet injectors is aligned transversely to this axis. During its transport, the substrate is positioned close enough to the apparatus surface so that the fluid jets emitted by the fluid jet injectors become immersed in a layer of spent fluid covering the surface, and therefore the emitted fluid jets constitute submerged fluid jets. Significantly, the row of fluid jet injectors is positioned closer to the entrance edge of the apparatus surface than to the exit edge. As a result, the resistance to fluid flow toward the exit edge, through the relatively long portion of the layer of spent fluid, is greater than the resistance to fluid flow toward the entrance edge, through the relatively short portion of the layer of spent fluid. Consequently, after the fluid jets emitted by the fluid jet injectors impinge upon the substrate, more than half the fluid associated with the fluid jets flows countercurrently toward the entrance edge, where it is vented via, for example, drain holes in the apparatus surface. Thus, dragout is substantially eliminated because fluid impinged upon the substrate is more readily removed after impingement, allowing fresh fluid to reach the substrate. In addition, the countercurrent flow prevents removed debris from being re-deposited or re-positioned on any portion of the substrate which has been impinged upon by the fluid jets. Moreover, the spent fluid layer and submerged fluid jets achieve a fluid bearing action on the substrate, reducing the need for rollers and guides, other than the rollers at the entrance edge and exit edge of the apparatus surface.

It must be noted that the substantial elimination of dragout via the invention enables the inventive fluid treatment apparatus to fluid treat substrates more efficiently than was previously possible. Thus, for example, the length of the inventive apparatus can now be much shorter than was previously possible, which is highly advantageous.

To avoid a torque on a substrate which might be imposed by the use of one row of fluid jets, the inventive apparatus preferably includes two surfaces, with each containing one or more rows of fluid jet injectors, between which a substrate to be processed is transported. Here, the fluid jets which impinge upon the upper and lower surfaces of the substrate substantially balance each other, thereby substantially eliminating torques.

In another embodiment of the invention, intended to even more completely eliminate dragout in substrates with holes, the inventive apparatus again includes two surfaces, with each surface containing one or more rows of fluid jet injectors, between which a substrate is to be transported. Each row of fluid jet injectors on one surface is aligned with a corresponding row of fluid jet injectors on the other surface. However, the fluid jet injectors of a row on one surface are offset relative to the fluid jet injectors of the corresponding row on the other surface so that if one were to project the former fluid jet injectors onto the latter surface, the former fluid jet injectors would be interdigitated with the latter fluid jet injectors. This interdigitation of the fluid jet injectors ensures that the fluid jets which penetrate the holes in the substrate are unopposed by counteracting fluid jets.

In yet another embodiment of the invention, the above-described countercurrent flow is achieved by providing at least two rows of fluid jet injectors on an apparatus surface over which a substrate is to be transported. Significantly, at least the second row of fluid jet injectors is inclined toward the entrance edge of the surface. As a result, the fluid jets emanating from the second row of fluid jet injectors induce more than half the fluid associated with the fluid jets emanating from the first row of fluid jet injectors to flow toward the entrance edge of the apparatus surface, after impingement upon the substrate.

BRIEF DESCRIPTION OF THE DRAWING(S)

The invention is described with reference to the accompanying drawings, wherein.

DETAILED DESCRIPTION OF THE PREFERRED EMBODIMENT(S)

The invention involves a fluid treatment apparatus, and a corresponding fluid treatment method, which substantially overcomes the problem of dragout, which avoids imposing torques on substrates and substantially reduces the need for rollers and guides for transporting substrates. These goals are achieved, in accordance with the invention, by employing a new configuration of fluid jet injectors in the inventive apparatus, producing a new configuration of fluid jets which impinge upon substrates undergoing fluid treatment, as more fully described below.

Figure 1:
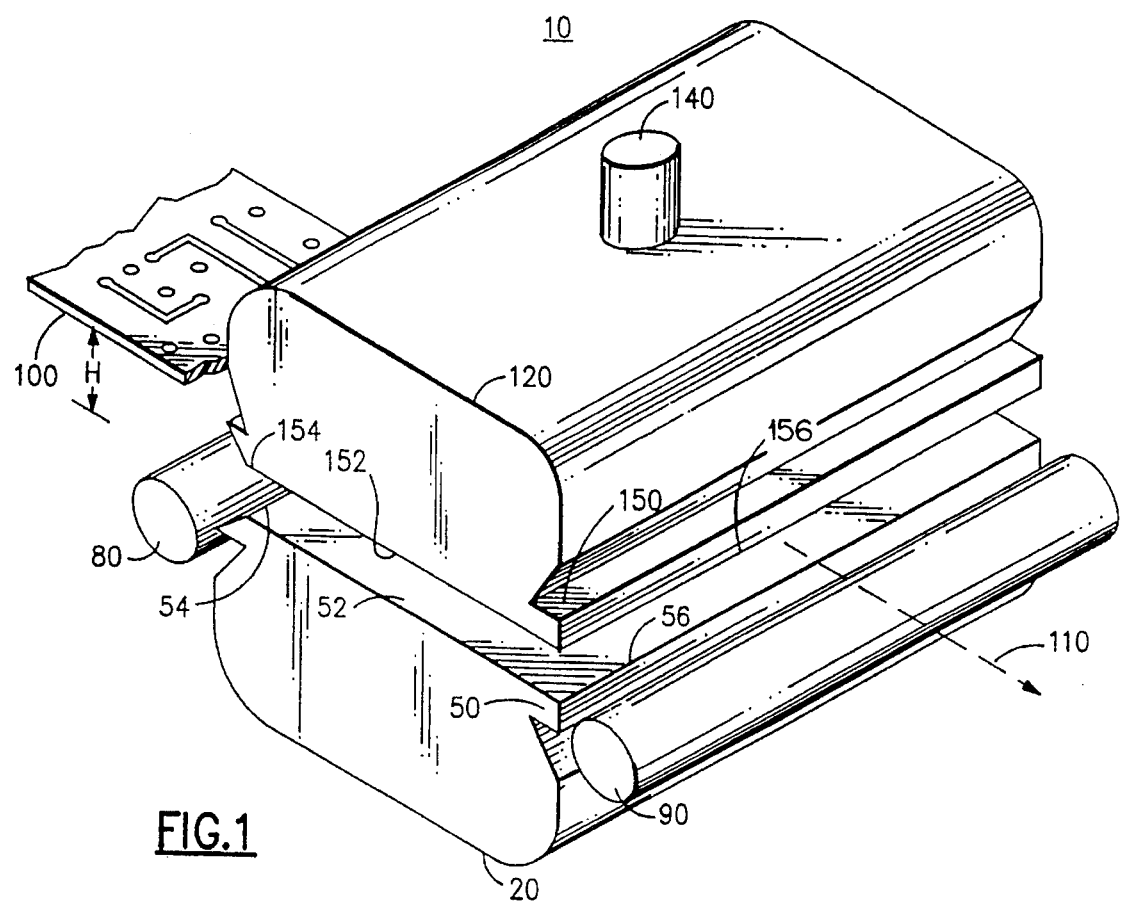
FIG. 1 is an isometric view of a first embodiment of the inventive apparatus.
Figure 2:
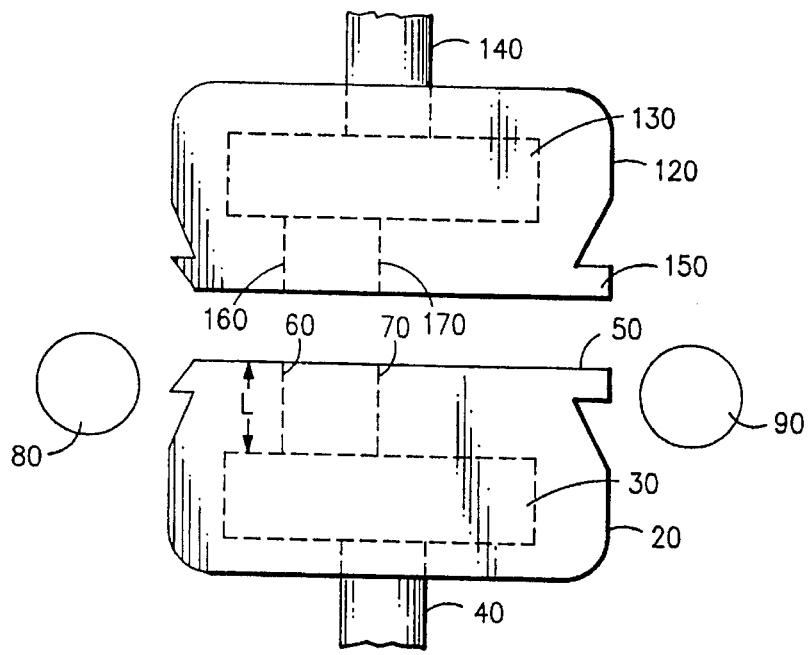
FIG. 2 is an end view of the embodiment shown in FIG. 1.

With reference to FIGS. 1 and 2, a first embodiment of the inventive fluid treatment apparatus 10 includes at least one plenum housing 20 made, for example, of stainless steel, which contains a plenum chamber 30 into which a fluid is fed under pressure via a feed tube 40. The plenum housing 20 is topped by a connected injector plate 50 made, for example, of aluminum. Significantly, at least one row 60 of at least two, spaced-apart, drilled holes extends from the plenum chamber 30 to the surface 52 of the injector plate 50, which holes serve as fluid jet injectors.

As shown more clearly in FIG. 1, the inventive apparatus 10 also includes rollers 80 and 90 which serve to transport a substrate 100, e.g., a printed circuit board substrate, at a distance, H, from the surface 52, from an entrance edge 54 to an exit edge 56 of the surface 52. This transport of the substrate 100 occurs along a direction which is substantially parallel to an imaginary axis 110 associated with the surface 52, which axis is oriented transversely to the entrance and exit edges 54 and 56, and extends from the entrance edge 54 to the exit edge 56, and beyond.

While not shown in FIGS. 1 or 2, the inventive apparatus 10 preferably also includes side walls in flush contact with the flat end faces of the plenum housing 20, which side walls serve to confine the fluid emitted by the fluid jet injectors.

Figure 3:
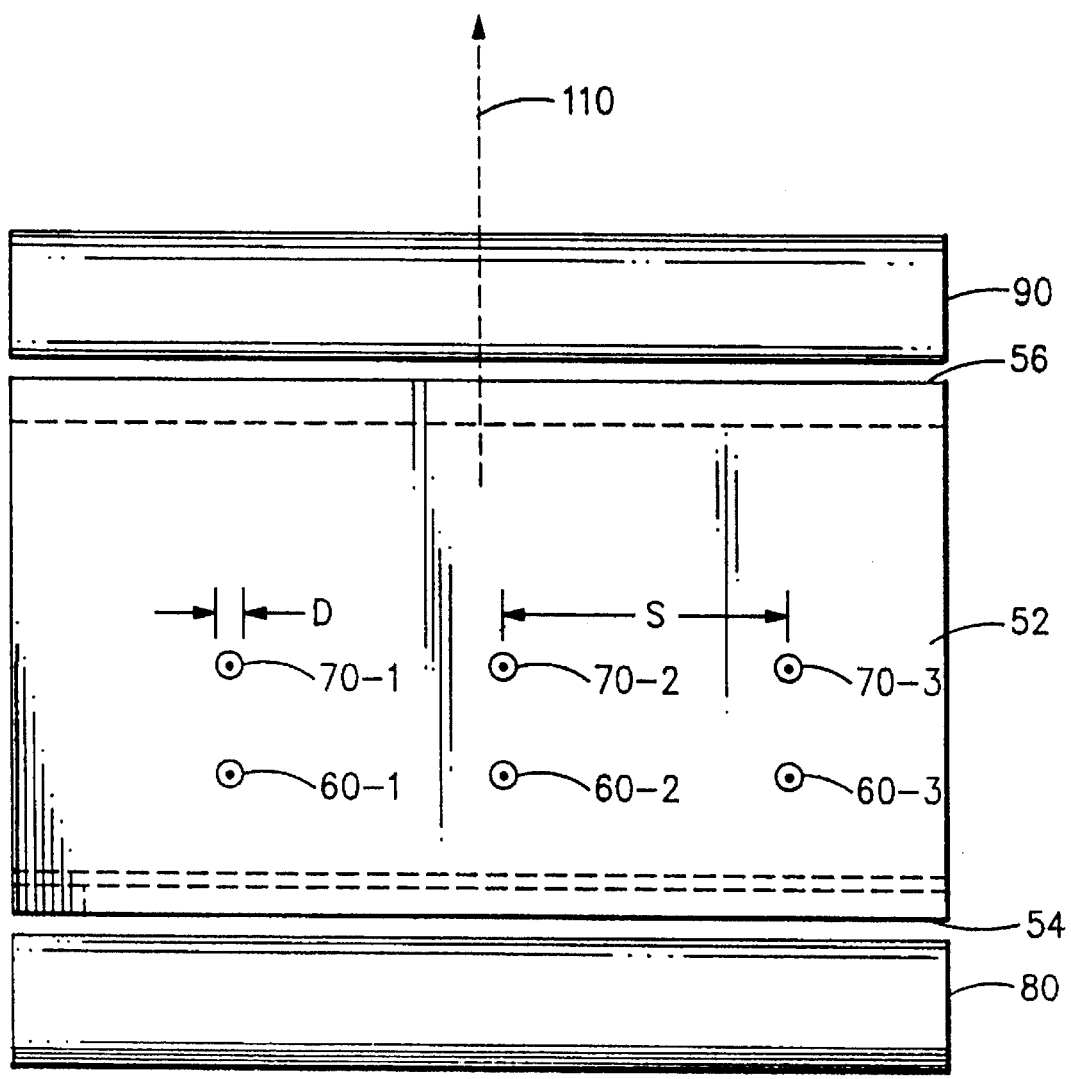
FIG. 3 is a top view of the embodiment shown in FIG. 1.

With reference now to FIG. 3, the at least one row 60 of fluid jet injectors includes the fluid jet injectors 60-1, 60-2, 60-3, etc., with the row 60 being inclined transversely to the imaginary axis 110. Preferably, each of the fluid jet injectors is of equal diameter, D, which ranges from about 5 mils (0.005 inches) to about 250 mils (0.25 inches). Fluid jet injectors having diameters smaller than about 5 mils are undesirable because they are difficult to fabricate. On the other hand, fluid jet injectors having diameters greater than about 250 mils are undesirable because they require an undesirably large amount of pump pressure to produce fluid jets.

With reference to FIG. 2, the drilled holes which constitute the fluid jet injectors are preferably all of equal length, L. In this regard, the ratio L/D preferably ranges from about 0.5 to about 40. Ratios less than about 0.5 are undesirable because they result in poorly developed fluid jets. Ratios greater than about 40 are undesirable because the corresponding fluid jet injectors are difficult to fabricate and require an undesirably large amount of pump energy to achieve a useful flow rate.

With reference once again to FIG. 3, the fluid jet injectors are preferably equidistantly spaced, with the center-to-center spacing between adjacent fluid jet injectors being denoted by S. The ratio S/D is necessarily greater than one (a ratio S/D=1 implies the fluid jet injectors are touching) but is preferably equal to or less than about 20. Ratios greater than about 20 are undesirable because after the corresponding fluid jets impinge upon the substrate 100, it has been found that the resulting fluid flows separate from the surface of the substrate 100 and form a region of recirculating fluid, which permits undesirable re-deposition of debris or spent fluid.

With reference to FIG. 1, as noted above, the fluid jets injected by the fluid jet injectors are to be submerged fluid jets, i.e., the fluid jets are to be injected into a layer of spent fluid covering the surface 52 and substantially filling the space between the surface 52 and the substrate 100. Such submerged fluid jets are achieved, in accordance with the invention, by bringing the substrate 100 into proximity with the surface 52 so that the ratio H/D ranges from about 0.2 to about 15. Ratios smaller than about 0.2 are undesirable because the substrate 100 is then so close to the surface 52 that the substrate is likely to become jammed against the surface 52. On the other hand, ratios greater than about 15 are undesirable because the substrate 100 is then so far from the fluid jet injectors that the corresponding fluid jets lose an undesirably large amount of momentum before impinging upon the substrate 100.

It should be noted that the spent fluid layer and fluid jets achieve a fluid bearing action on the subsrate 100. As a consequence, the need for rollers and guides between the entrance edge 54 and the exit edge 56 for transporting the substrate 100 is eliminated.

Because the fluid jet injectors are preferably all of equal diameter, D, and are all connected to the same plenum chamber 30, the fluid supplied to each of the fluid jet injectors is necessarily the same, and the speed of the fluid jets emanating from the fluid jet injectors is necessarily also the same. If the kinematic viscosity of the supplied fluid is denoted by nu and the speed of the fluid jets at the fluid jet injectors is denoted by V, then the Reynolds number associated with each of the fluid jets, defined as the ratio V*D/nu, preferably ranges from about 50 to about 30,000. Reynolds numbers less than about 50 are undesirable because the corresponding fluid jets have undesirably small momenta. On the other hand, Reynolds numbers greater than about 30,000 are undesirable because the achievement of such high Reynolds numbers requires undesirably high plenum pressures.

In accordance with the invention, and as noted above, the row 60 of fluid jet injectors is positioned closer to the entrance edge 54 (see FIG. 3) of the surface 52 than the exit edge 56. As a result, in the operation of the apparatus 10, the resistance to fluid flow from the row 60 toward the exit edge 56, through the relatively long portion of the layer of spent fluid covering the surface 52, is relatively high. By contrast, the resistance to fluid flow from the row 60 toward the entrance edge 54, through the relatively short portion of the layer of spent fluid covering the surface 52, is relatively low. Consequently, after the fluid jets emitted by the row 60 of fluid jet injectors impinge upon the substrate 100, more than half the fluid associated with the fluid jets flows countercurrently toward the entrance edge 54. Thus, undesirable dragout and re-positioning of debris is substantially reduced or eliminated.

Although not shown in the drawings, the injector plate 50 preferably includes a row of drain holes positioned adjacent the entrance edge 54, aligned transversely to the imaginary axis 110. These drain holes permit ready venting of the above-described countercurrently flowing fluid. Moreover, if a pump is used to pump fluid out of the drain holes, then the countercurrent flow is enhanced.

Preferably, although not shown in the drawings, the injector plate 50 also includes a row of drain holes positioned adjacent the exit edge 56, aligned transversely to the imaginary axis 110. These additional drain holes serve to vent the relatively small amount of fluid which flows toward the exit edge.

As shown in FIGS. 2 and 3, the first embodiment of the inventive apparatus 10 preferably includes a second row 70 of fluid jet injectors, penetrating the surface 52, aligned transversely to the imaginary axis 110. Significantly, this second row 70 of fluid jet injectors, which includes fluid jet injectors 70-1, 70-2, 70-3, etc., is positioned between the row 60 of fluid jet injectors and the exit edge 56, and is preferably equidistantly positioned between the entrance edge 54 and the exit edge 56. By virtue of the presence of the fluid jets emitted by the second row 70, the above-described countercurrent flow associated with the fluid emitted by the first row 60 is enhanced.

To avoid imposing a torque on the substrate 100, and as depicted in FIGS. 1 and 2, the first embodiment of the inventive apparatus 10 preferably includes a second plenum housing 120, containing a plenum chamber 130 into which fluid is fed under pressure via a feed tube 140. An injector plate 150 is mounted on the plenum housing 120, with rows 160 and 170 of fluid jet injectors extending from the plenum chamber 130 to the surface 152 of the injector plate 150. The fluid jets emitted by the rows 160 and 170, which impinge upon the upper surface of the substrate 100, serve to counterbalance the fluid jets emitted by the rows 60 and 70, which impinge upon the lower surface of the substrate 100. As a result, undesirable torques on the substrate 100 are avoided.

Figure 4:
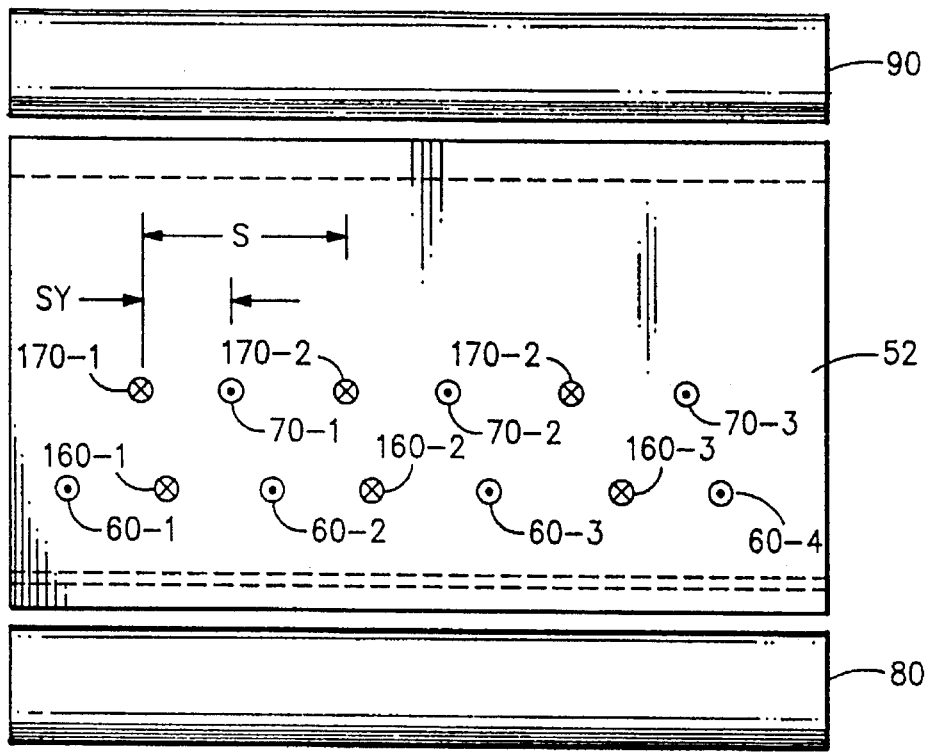
FIG. 4 is a top view of a second embodiment of the inventive apparatus.
Figure 5:
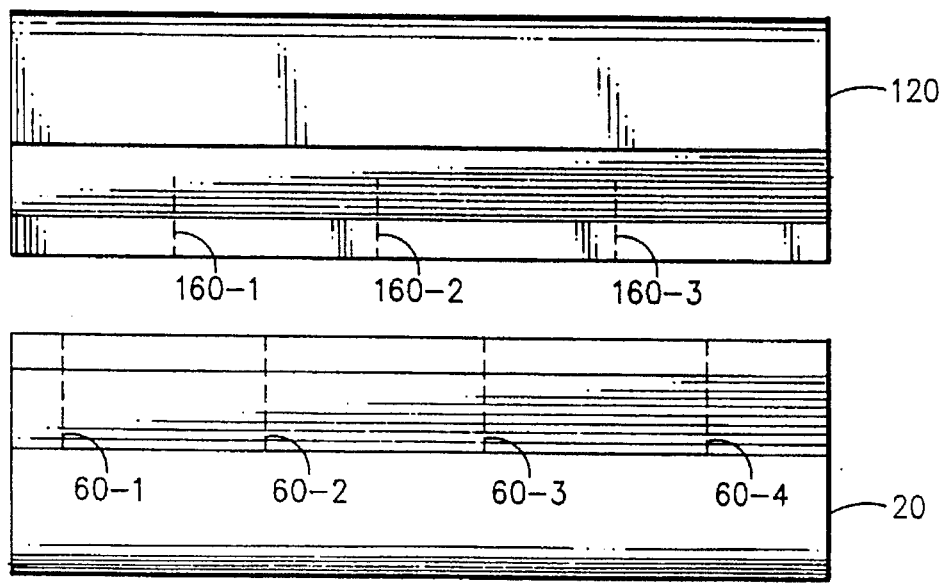
FIG. 5 is a front view of the second embodiment of FIG. 4.

With reference now to FIGS. 1, 4 and 5, a second embodiment of the inventive apparatus 10 is generally similar to the first embodiment. This second embodiment definitely includes both the plenum housing 20 and the plenum housing 120, and the surfaces 52 and 152 define a channel having an entrance adjacent the entrance edges 54 and 154 and an exit adjacent the exit edges 56 and 156. This channel is characterized by an axis which is oriented transversely to the entrance and exit edges 54,154,56 and 156, and extends from the entrance of the channel to the exit of the channel.

In connection with the second embodiment, the substrate 100 is transported via rollers 80 and 90 through the above-defined channel in a direction which is substantially parallel to the channel axis. This transport occurs at a distance, H1, above the surface 52 and at a distance, H2, below the surface 152. The distances H1 and H2 need not be the same.

As shown in FIGS. 4 and 5, the second embodiment includes at least one row 60, and preferably two rows 60 and 70, of fluid jet injectors penetrating the surface 52. The fluid jet injectors of the rows 60 and 70 are of equal diameter, D1, and the fluid jets which they emit exit the fluid jet injectors with fluid speed V1. The fluid in these fluid jets is characterized by a kinematic viscosity nu1. Preferably, the row 60 is positioned closer to the entrance edge 54 than to the exit edge 56, for the reason discussed above.

The second embodiment also includes at least one row 160, and preferably two rows 160 and 170, of fluid jet injectors penetrating the surface 152. The fluid jet injectors of the rows 160 and 170 are of equal diameter D2, and the fluid jets which they emit exit the fluid jet injectors with fluid speed V2. The fluid in these fluid jets is characterized by a kinematic viscosity nu2. The diameter D2 is not necessarily equal to the diameter D1, the kinematic viscosity nu2 is not necessarily equal to the kinematic viscosity nu1, and the fluid speed V2 is not necessarily equal to the fluid speed V1.

In the second embodiment, like the first embodiment, the ratios H1/D1, H2/D2, V1*D1/nu1 and V2*D2/nu2 fall within the ranges given above, for the reasons given above.

As shown more clearly in FIG. 4, the second embodiment differs from the first embodiment in that the row 160 is shifted relative to the row 60 so that if the row 160 were to be projected onto the surface 52 (as depicted in FIG. 4), the fluid jet injectors of the row 160 would be interdigitated with the fluid jet injectors of the row 60. The row 170 is similarly shifted relative to the row 70. The purpose of these shifts is to ensure that fluid jets which penetrate holes in the substrate 100 are unopposed by counteracting fluid jets, which substantially eliminates dragout in such holes.

The amount of the above-described shift, denoted Sy, is chosen so that the ratio Sy/S is greater than 0 but less than 1. Ratios equal to 0 and 1 imply an absence of interdigitation.

It should be noted that the second embodiment has been found to be particularly useful in rinsing substrates having holes.

Figure 6:
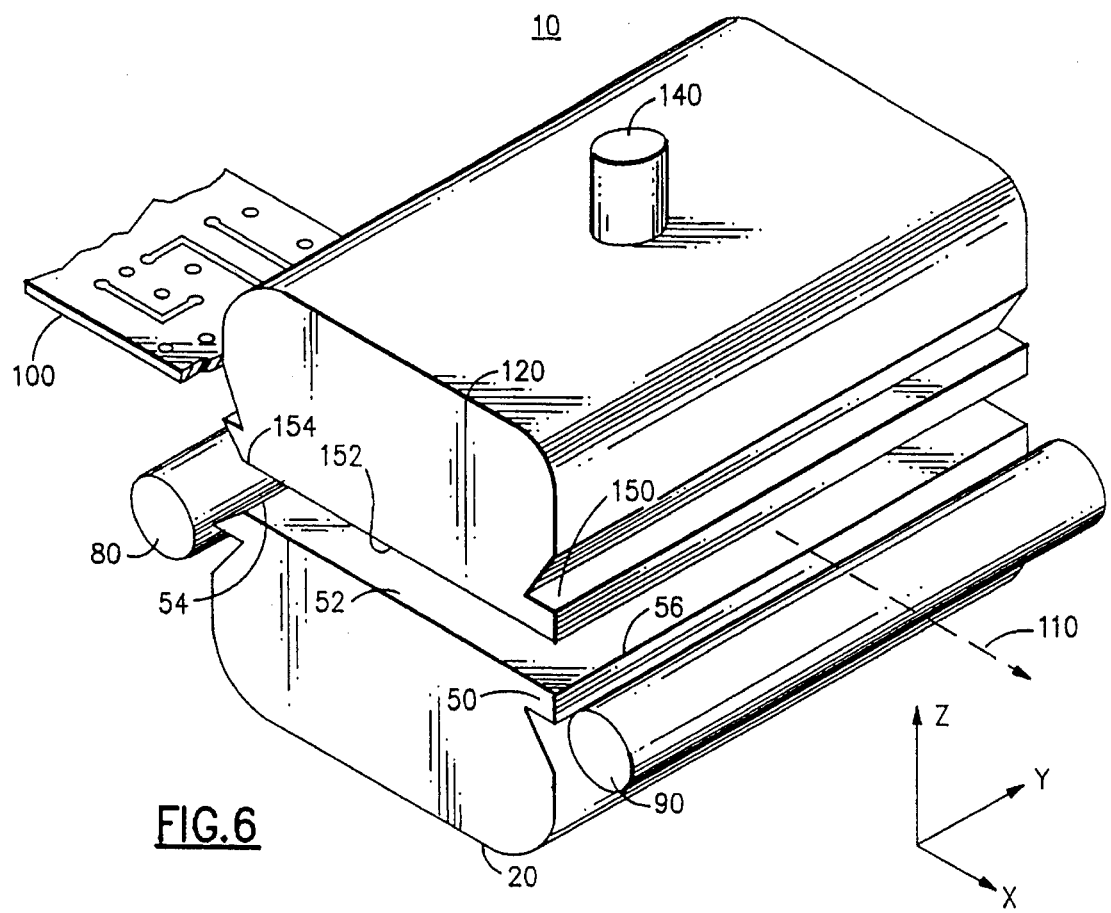
FIG. 6 is an isometric view of a third embodiment of the inventive apparatus.

With reference now to FIGS. 6, 7, 8 and 9, a third embodiment of the inventive apparatus is generally similar to the first and second embodiments, and is characterized by a coordinate system x,y,z, as pictured in FIG. 6. As shown, the x-axis is parallel to the axis 110 associated with the surface 52, here referred to as the transport axis. The y-axis lies in a least-squares-fit planar approximation to the surface 52 and is perpendicular to the x-axis. The z-axis is perpendicular to both the x-axis and the y-axis.

The third embodiment differs from the second embodiment in that each of the fluid jet injectors in row 70 is inclined toward the entrance edge 54. Moreover, each of these fluid jet injectors forms an angle, theta, with the z-axis, as measured in the counterclockwise direction in a plane defined by the z-axis and x-axis, which is greater than 0 degrees but less than 90 degrees. Such an inclination, and range of angles, theta, enhance the countercurrent flow associated with the fluid emitted by the fluid jet injectors in the row 60, discussed above.

Preferably, the fluid jet injectors in the row 70 are also inclined toward the y-axis. Moreover, each such inclined fluid jet injector forms an angle, phi, with the z-axis, as measured in the clockwise direction in a plane defined by the z-axis and the y-axis, which is greater than 0 degrees but less than 90 degrees. This y-axis inclination is advantageous because it induces the fluid emitted by the fluid jet injectors in the row 60, after impingement upon the substrate 100, to flow laterally in the direction of the y-axis, which also serves to eliminate dragout.

Figure 7:
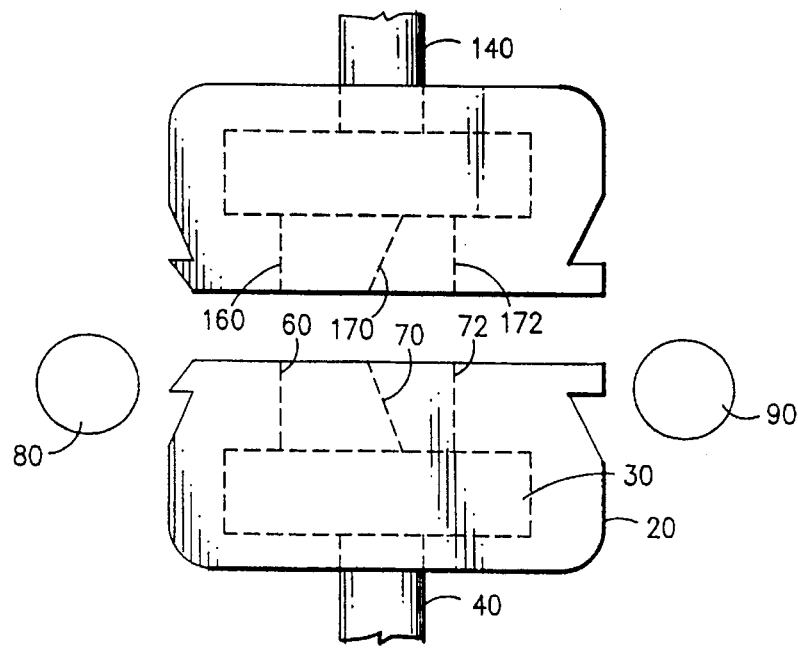
FIG. 7 is an end view of the embodiment shown in FIG. 6.
Figure 8:
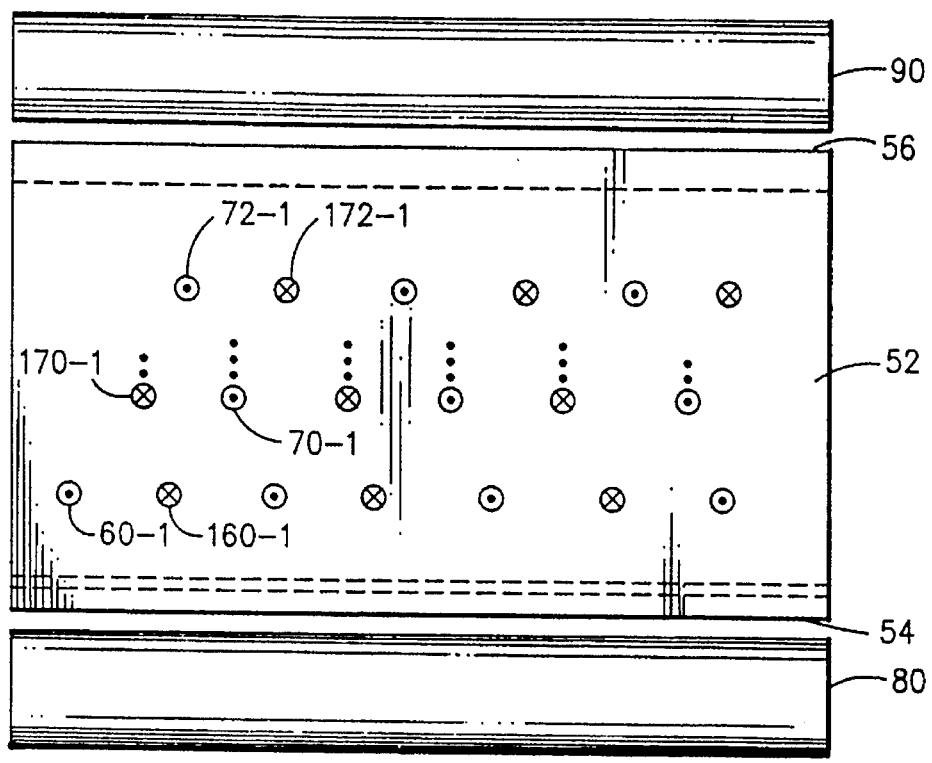
FIG. 8 is a top view of the embodiment shown in FIG. 6.
Figure 9:
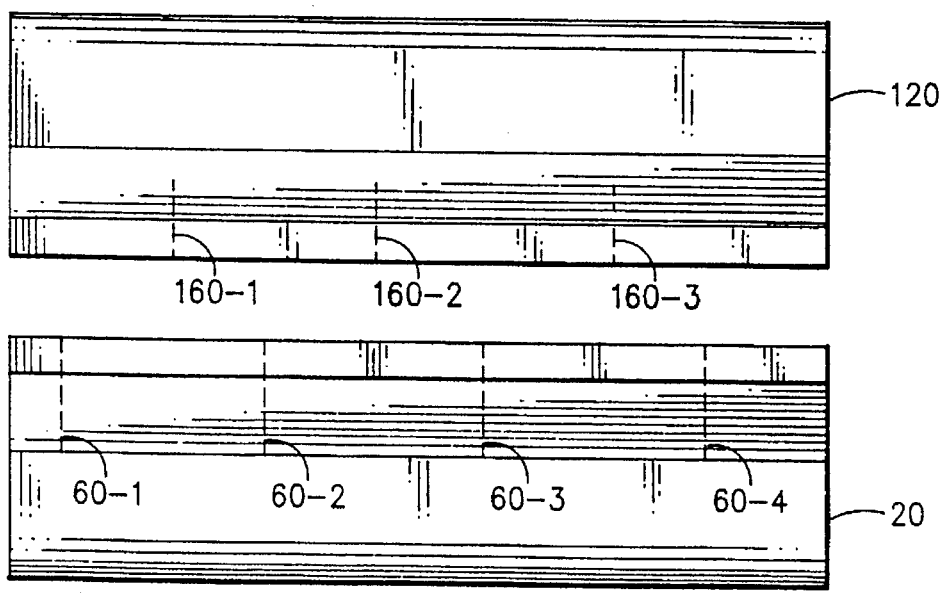
FIG. 9 is a front view of the embodiment shown in FIG.6.

As shown in FIGS. 7 and 8, the third embodiment also includes a row 72 of fluid jet injectors penetrating the surface 52. This third row is advantageous because the corresponding fluid jets serve to stabilize the motions of substrates, particularly relatively thin substrates.

As also shown in FIGS. 7 and 8, the surface 54 is penetrated by rows 160, 170 and 172 of fluid jet injectors, which mirror the rows 60, 70 and 72 penetrating the surface 52.

It should be noted that the third embodiment has been found to be particularly advantageous in drying substrates with holes.

Significantly, the inventive apparatus, described above, has made it possible to create a new fluid treatment system in which a substrate, e.g., a ceramic substrate, undergoes two or more different but continuous fluid treatments, i.e., the different fluid treatments are applied sequentially but with no interruption between fluid treatments. A preferred embodiment of the new fluid treatment system, which achieves such continuous operation, as well as the corresponding fluid treatment process, is described below.

Figure 10:
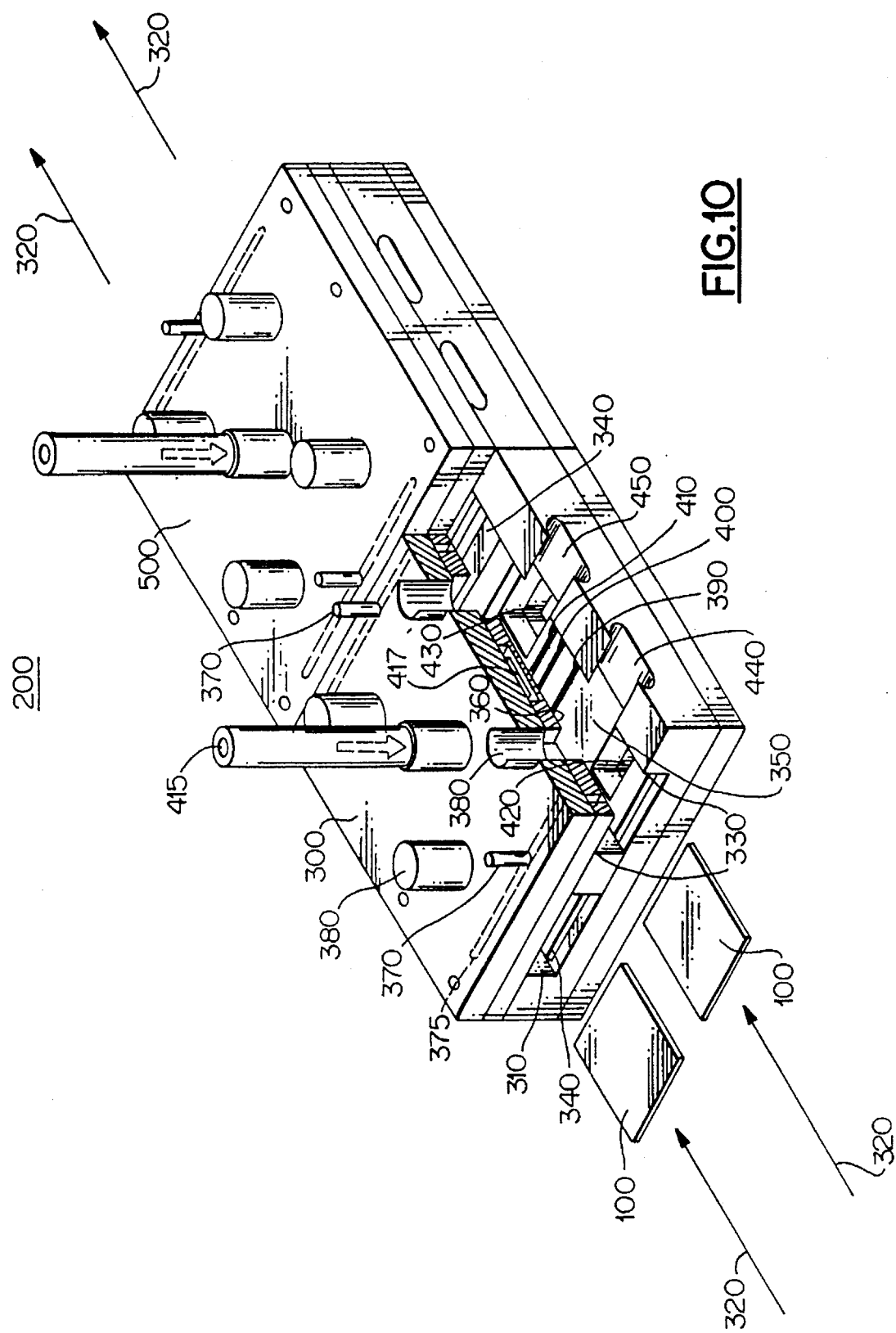
FIGS. 10 and 11 are isometric views of two embodiments of the inventive fluid treatment system.

As depicted in FIG. 10, the inventive system 200 includes at least two fluid treatment compartments 300 and 500, with fluid treatment compartment 500 being immediately adjacent to fluid treatment compartment 300. In principle, the inventive system 200 may include almost any number of fluid treatment compartments, with each successive compartment being immediately adjacent to the preceding compartment.

As shown in FIG. 10, the fluid treatment compartment 300, which is typical of all the fluid treatment compartments of the system 200, includes at least one, and preferably two or more, substantially parallel, longitudinal channels 310, which receive substrates 100. The fluid treatment compartment 500 includes similar such longitudinal channels, which are aligned with the channels 310. Thus, in the operation of the system 200, when a substrate 100 is inserted into a channel 310, it unergoes fluid treatment with a first fluid within the compartment 300. When this first fluid treatment is completed, another substrate is inserted into the same channel 310, and this act of insertion serves to push the previously processed substrate into the succeeding, aligned channel in the fluid treatment compartment 500, where this substrate is treated with a second fluid.

Preferably, the substrates to be fluid treated are mounted, and linearly aligned, in a holder positioned adjacent the entrance to a channel 310. By using a push rod to push against the substrate furthest from the entrance, the substrate closest to the entrance is readily inserted into the channel 310. By again using a push rod to push against the substrate furthest from the entrance, another substrate is inserted into the channel 310 and the substrate already in the channel 310 is thereby pushed into the succeeding channel in the compartment 500, without any of these substrates being touched, and thereby contaminated, by human hands.

To ensure that each substrate 100 moves in a direction which is substantially parallel to a longitudinal axis 320 of the corresponding channel, each channel 310 is provided with a pair of substantially parallel, longitudinal guides 330. These guides 330 are in the form of two opposed, right-angle steps formed in two opposed walls of the channel. The vertical sidewalls of the right-angle steps, which are substantially parallel to each other, prevent a substrate 100 from undergoing lateral displacements from the intended path as the substrate moves through the channel. The horizontal walls of the right-angle steps serve to support the substrate as the substrate moves through the channel. However, by virtue of the fluid bearing action on the substrate 100, described below, there is essentially no frictional contact between the substrate and the horizontal and vertical walls of the guides 330. As a consequence, the horizontal and vertical walls experience essentially no wear, and the creation of undesirable particulate contaminants is avoided.

In general, the fluid employed in any fluid treatment compartment is different from that employed in an adjacent fluid treatment compartment. To prevent undesirable intermingling of the different fluids, intermingling-prevention apparatus is provided adjacent the entrance and exit of each channel 310. This apparatus, which produces a so-called air knife adjacent the entrance and exit of each channel 310, includes at least four rows 340 of air jet injectors. Each such air jet injector is vertically oriented, each row of air jet injectors includes at least two, spaced-apart air jet injectors and each such row is aligned transversely to the corresponding longitudinal axis 320. The first of the rows 340 of air jet injectors is formed in a lower surface 350 of the channel 310, adjacent the entrance to the channel, while a second of these rows is formed in the same lower surface 350, adjacent the exit of the channel 310. The third and fourth of these rows 340 of air jet injectors are formed in an upper surface 360 of the channel 310, as mirror images of the first and second rows. The air supplied to the air jet injectors formed in the upper surface 360 is communicated via air inlets 370 and air manifolds 375 provided at or near the top of each fluid treatment compartment. Similar such air inlets and air manifolds (not shown in FIG. 10) provided at or near the bottom of each fluid treatment compartment, supply air to the fluid jet injectors formed in the lower surface 350. Standpipes 380, which extend through holes in both the top and bottom of each fluid treatment compartment, serve to exhaust the air associated with the air jets produced by the air jet injectors.

As with the fluid jet injectors described above, the air jet injectors preferably have diameters, D, ranging from about 5 mils (0.005 inches) to about 250 mils (0.25 inches). Diameters outside this range are undesirable for the reasons given above.

The Reynolds numbers associated with the air jets emitted by the air jet injectors preferably range from about 50 to about 30,000. Reynolds numbers outside this range are undesirable for the reasons given above.

In the operation of the intermingling-prevention apparatus, the rows 340 of air jet injectors produce rows of vertically oriented air jets which create a wall of air between adjacent fluid treatment compartments, preventing intermingling of the different fluids used in the adjacent fluid treatment compartments. Fluids, e.g., gases, other than air are also useful for the purpose of preventing intermingling of the different fluids. It should be noted that the air jets produce a fluid bearing action on the substrate areas impinged by the air jets.

Preferably, fluid treatment within each fluid treatment compartment of the system 200 is achieved by employing any one of the configurations of fluid jet injectors depicted in FIGS. 2–5 and 7–9. That is, as shown in FIG. 10, each of the lower and upper surfaces 350 and 360 of each channel 310 of each fluid treatment compartment includes at least one row 390 of at least two, spaced-apart fluid jet injectors aligned transversely to the corresponding longitudinal axis 320. As before, each row 390 of fluid jet injectors is positioned closer to the entrance edge, than to the exit edge, of the corresponding surface to produce the countercurrent effect described above. Additional rows 400 and 410 of fluid jet injectors may also be provided, as shown in FIG. 10, to enhance the countercurrent effect. All of these rows of fluid jet injectors are supplied with fluid via fluid inlets 415 and fluid manifolds 417, at the top and bottom of the compartment 300. The dimensions of, and spacing between, the fluid jet injectors, as well as the corresponding Reynolds numbers, are as described above. In addition, the distances Hi and H2 between a substrate undergoing fluid treatment and, respectively, the surfaces 350 and 360 are also as described above. Consequently, the fluid jets emitted by the fluid jet injectors also achieve a fluid bearing action on the substrate undergoing fluid treatment, in addition to the countercurrent effect. Thus, as noted above, frictional contact between the substrate and the horizontal and vertical walls of the guides 330 is avoided.

As depicted in FIG. 10, each fluid treatment compartment includes drains 420 and 430 in the lower surface 350, adjacent the entrance and exit of the compartment, to drain the fluid associated with the fluid jets emitted by the fluid jet injectors penetrating the surface 350. The standpipes penetrating the lower surface also serve this purpose. However, a substrate undergoing fluid treatment will necessarily be positioned between the fluid jets emitted by the fluid jet injectors penetrating the upper surface 360 and the drains 420 and 430, thereby blocking access to these drains. Consequently, side drain slots 440 and 450 are also provided to drain the fluid associated with the fluid jets emitted by the-fluid jet injectors penetrating the surface 360.

Figure 11:
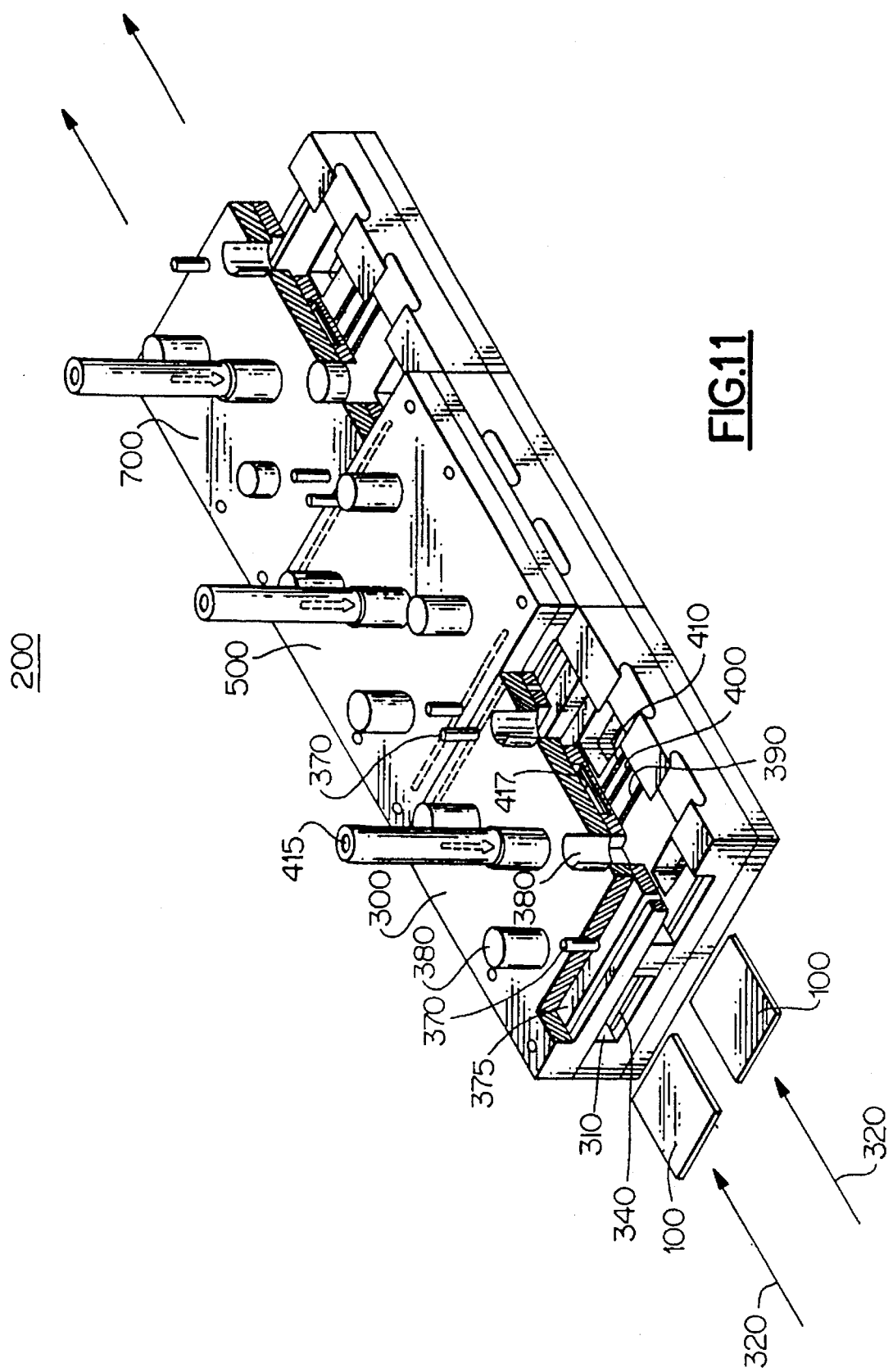

With reference now to FIG. 11, which depicts the fluid treatment system 200 as including three fluid treatment compartments 300, 500 and 700, it should be noted that the orientation of the last fluid treatment compartment (i.e., the fluid treatment compartment 700) is preferably reversed, relative to that of the preceding compartments. That is, what would otherwise be the exit of the fluid treatment compartment 700 is positioned immediately adjacent to the exit of the fluid treatment compartment 500. Consequently, when a fluid, such as air, is supplied to the fluid jet injectors of the fluid treatment compartment 700, the fluid associated with the fluid jets produced by these fluid jet injectors flows concurrently (in the direction of motion of the substrate 100), rather than countercurrently, which serves to expel a substrate 100 in the compartment 700. In addition, the standpipes of the compartment 700 closest to the compartment 500 are blocked off, as shown in FIG. 11, and therefore these standpipes do not serve to exhaust the air associated with the air knife closest to the compartment 500. Rather, this air necessarily flows into the compartment 500 and is exhausted through the standpipes of compartment 500. Significantly, this flow of air from compartment 700 into compartment 500 serves as a brake on the forward motion of a substrate from compartment 500 into compartment 700. Thus, compartment 700 prevents unwanted ejections of substrates from the system 200, while also serving to eject substrates which have been intentionally inserted (via the push rod) into compartment 700.

In the preferred embodiments of the fluid treatment system 200, described above, it has been assumed that all of the fluid treatment compartments employ fluid jets. However, embodiments which include one or more compartments employing, for example, fluid sprays are also useful.

It should be noted that the fluid treatment system 200 can, for example, be made mobile by mounting the system on a cart, which can then be rolled to any desired location along a processing line to achieve in-situ fluid treatment of a substrate. Alternatively, the fluid treatment system 200 can be incorporated in-line into a processing line.

While the invention has been particularly shown and described with reference to preferred embodiments thereof, it will be understood by those skilled in the art that various changes in form and details may be made therein without departing from the spirit and scope of the invention.

EXAMPLE 1

Rinsing of circuit boards was compared using a standard spray rinse vs. the invention apparatus. The comparison looked at conveyor length used for rinsing, electricity usage, flow rate of rinse water used, and resultant ionic contamination on the circuit boards. For both parts of the experiment, one or two DSM (double spray modules), horizontally conveyorized wet processing equipment built by Chemcut in State College, Pa., were used in a counter-current rinse configuration. For the standard spray rinsing tests, two modules were used in series, with the spent waste water of the second module cascading to the first module and then to waste treatment. Each module had solid cylindrical "squeegee" type rollers at its entrance and exit and had its own pump supplying the sprays. For the invention apparatus rinsing tests, a single module was fitted with four pairs of the apparatus having the preferred embodiment for rinsing as shown in FIGS. 4 and 5.

Each apparatus pair for the rinsing embodiment was characterized by two surfaces with an an entrance-to-exit length of 1.13". Two rows, each containing 327 0.030" dia. injectors, were placed in both the upper and lower surfaces at distances from the entrance edge of the device of, respectively, 0.425" and 0.692". The injectors were made by drilling holes through 0.5" thick polycarbonate plastic. Center-to-center spacing of the 0.030" dia. injector holes within each of the four rows was 0.090". The injectors in the first and second rows in the upper surface were positioned so that their projection onto the lower surface was centered between the injectors in the first and second rows in the lower surface, respectively. The y-position of the injectors in the second row in each surface was offset from the y-position of the injectors in the respective adjacent first row by 0.068". A 10 degree beveling of the first 0.16" of the upper and lower surfaces served as a guide for the substrates. Two rows of drain holes were included with diameters of 0.143" and spaced center-to-center within a row 0.192" apart were placed with centers spaced 0.220" and 0.221" from the entrance and exit edges, respectively. The distance, H1, of the lower surface from the bottom of the substrate was 0.10" and the distance, H2, of the upper surface of the device from the top of the substrate was 0.25". The rinsing fluid, water, having a viscosity, nu, of 0.01 cm\*\*2/sec, was passed through each of the injectors with a velocity V of 302 cm/sec, giving a Reynolds number, Re, of about 2300. Each apparatus pair had at its entrance and exit side a pair of solid cylindrical "squeegee" conveyor rollers and was provided with a pump and sump. The water was re-circulated from each respective sump to the respective apparatus, after which the water would fall back into the sump. At the same time, incoming water caused the sump water to cascade continuously to the stage preceding and finally to waste treatment. By "stage preceding", it is meant the stage through which the circuit board would travel immediately prior to the current stage. The water cascaded from stage to stage in the opposite direction to the direction of circuit board travel. This arrangement of water cascade direction relative to product travel direction, is known as "counter-current rinsing" in the art, is the most efficient in terms of both overall water usage and cleanliness of the final rinse, and was used in both the spray and invention apparatus tests.

Each run consisted of ten circuit boards measuring 10×15×0.060 inches and having a mixture of 0.050 inch and 0.018 inch diameter holes. There were copper traces on epoxy dielectric on the surface. The circuit boards were run at 120 inches per minute through a microetch chamber, followed by the rinse, and air dried. The microetch consisted of approx. 40 g/l sodium persulfate and 40 g/l sulfuric acid dissolved in water. Resultant contamination was measured using an Omega ionograph meter which had been calibrated to give conductivity readings in equivalent NaCl contamination in micrograms/square inch of circuit board. Water usage was measured with a float-type see-through flowmeter, and power usage was determined with a hand-held current meter.

Results:

| Fluid Delivery Device | Water usage gal/min | Ionic contamination on product micro g/sq. in. (NaCl equivalent) | Conveyor length feet | Electrical Usage Kilowatts |
|---|---|---|---|---|
| Spray (2-stage) | 5 | 1.4 | 4 | 2.7 |
| Invention Apparatus (4-stage) | 1 | 1.7 | 2 | 1.6 |

As can be seen from the data, the invention showed an essentially equivalent contamination level while using 40% less electricity (four smaller pumps feeding the apparatuses of the invention used less electricity than the two larger pumps feeding the sprays) and generating 80% less water waste by volume, all in 50% less conveyor space than the standard spray system. As far as water usage is concerned, let it be noted that theoretically a four-stage spray rinse could use just as small an amount of water as a four-stage rinse incorporating the invention apparatus. However, such a four-stage spray rinse would occupy four times as much conveyor space and would consume three and one-third times as much electricity as the invention apparatus.

EXAMPLE 2

Drying of circuit boards was compared using the invention apparatus versus two state-of-the art dryers. Comparison results were measured for both high and normal aspect-ratio thru-holes in terms of electricity usage and conveyor length.

The state-of-the-art dryer used as a basis of comparison for hi-aspect ratio thru-holes was a SHD ("small hole dryer") built by International Supplies of Parma, Italy. Circuit boards run through this machine were approximately 0.300 inches thick and 24×28 inches in width and length with thousands of approx. 0.015 inch dia. thru-holes. The dryer used four "push-pull" slotted manifolds run by a turbine blower that forced pressurized air against one side of the circuit board and suction to the opposing side. The push-pull was alternated so that the pressure side alternated up, down, up and then down. Following the forced-air slotted blowers were two heated fan blowers that recirculated hot air. When the circuit boards were conveyed through this configuration at 1 meter/minute, many of the thru-holes were still wet, leading to unwanted stains that were deleterious in subsequent processes. A single pair of the invention apparatuses with the preferred drying embodiment as shown in FIGS. 6–9 were installed with a turbine blower feeding each side. The apparatus pair for the drying embodiment was characterized by two surfaces with an an entrance-to-exit length of 2.25". Three rows, each containing 171 0.043" dia. injectors, were placed in both the upper and lower surfaces at distances from the entrance edge of the device of, respectively, 0.500", 0.650", and 1.125". The injectors in the upper and lower surfaces, respectively, were made by drilling holes through 0.3" and 0.5" thick aluminum metal. Center-to-center spacing of the 0.043" dia. injector holes within each of the four rows was 0.150". The injectors in the first, second and third rows in the upper surface were positioned so that their vertical projection onto the lower surface was centered between the injectors in the first, second, and third rows in the lower surface, respectively. The y-position of the injectors in the second and third rows in each surface was offset from the y-position of the injectors in the adjacent first row by 0.050" and 0.100", respectively. An 18 degree beveling of the first 0.375" of the upper and lower surfaces served as a guide for the substrates. The injectors in the upper and lower surfaces were drilled at a 15 degree angle so that jets issuing from them were tilted towards the entrance of the device. The distance, H1, of the lower surface from the bottom of the substrate was 0.050" and the distance, H2, of the upper surface of the device from the top of the substrate was 0.250". The drying fluid was air having a viscosity, nu, of 0.17 cm**2/sec, and was passed through each of the injectors with a velocity V of 9000 cm/sec, giving a Reynolds number, Re, of about 5800.

With the invention installed, at 1 meter/min conveyor speed, and with the two heated blowers off, all of the thru-holes were dry.

The state-of-the-art dryer used as a basis of comparison for normal aspect-ratio thru-holes was a "TMDM" dryer built by Chemcut of State College, Pa. Circuit boards run through this machine were approximately 0.060 inch thick and 10×15 inches in width and length. The dryer used several different blowers and manifolds and also used a heated rinse with the intent to allow the water retained on the panel to dry more rapidly. When panels were sent through this machine at 2 meters/minute they dried sufficiently, but when they were sent through at 3 meters/minute they still had wet spots. In comparison, the same drying apparatus pair used in the hi-aspect ratio tests above dried the panels completely at 3 meters/minute conveyor speed.

To qualitatively test the amount of air venting from the entrance of the device vs. from the exit, a strip of paper was held vertically immediately before and behind the apparatus. Using this method, it was noted that a strong positive flow of air issued from the device entrance, but that a neutral if not slightly negative flow of air was issuing from the device exit. In other words, it appeared that air was actually being sucked into the exit side of the device, probably due to Bernoulli effects. From these observations, it is clear that the invention produces an exceptionally good counter-current flow of air against the travelling substrate, which is also advantageous to efficient drying.

A summary of the drying comparison follows:

|  | Conveyor length feet | Electrical Usage Kilowatt |
|---|---|---|
| Low aspect-ratio |  |  |
| State-of-the art | 4 | 10 |
| Invention Apparatus | .5 | 4 |
| High aspect-ratio |  |  |
| State-of-the art | 5.5 | >15 |
| Invention Apparatus | .5 | 4 |

As can be seen, all other things being equal, the invention is very economical in terms of both conveyor space and electrical usage. The fact that heated air is not needed is also a plus since this reduces the risk of oxidation of the copper traces on the circuit boards.

EXAMPLE 3

Cleaning of ceramic substrates was accomplished with the inventive fluid treatment system. The cleaning results are compared with those achieved using a prior cleaning system, employing vacuum-air blow cleaning. The prior cleaning system consisted of an air knife blower, operated with compressed air supplied at 80 psi. The knife is a manifold slot 0.040 inches wide angled at 20 degrees toward the adjacent vacuum port. This air knife slot is continuous for the width of the substrate, 0.250 inches above the surface to be cleaned. The vacuum port, connected to a "house vacuum" supply had the port located 0.500 inches away from the air knife and 0.250 inches above the surface. The port extended across the full width of the substrate.

The intent of the prior system is to dislodge debris on the substrate surface and simultaneously vacuum it away from the area. Such systems are in common use for debris removal applications.

The inventive fluid treatment system included six fluid treatment compartments (herein referred to as heads). All heads were identical and supplied with the following fluids: air; water; water; air; air; and air. The last head was reversed to provide braking action and the 2 leading standpipes are plugged as described above. The water supply was provided by an electric pump rated at 20 psi max for each of the two water heads. These pumps were throttled to a flow rate of 3.5 gallons per minute and the output water was filtered to 0.2 microns after the pump, directly prior to the head. The water pressure measured at the head was reduced through the flow system and injectors to 4 psi. The pump system plumbing was constructed of standard ½ inch tubing to each head. Drainage was provided in each head by a 1.125×1.5 inch hole, the top hole was reduced to a 1 inch diameter pipe referred to as the standpipe. This standpipe was 6 inches long, and the bottom drain hole was located so as to allow the drained water to return to the supply tank. The upper half of the head had side drains sized to ¼ inch by 1 inch long. The supply tanks for water were two cascading tanks, 8 gallons each, with the last water head supplied from the fresh water flow tank. The first head drained into the second cascading (dirty) tank, and this tank was drained to waste. The cascading tanks were supplied at a flow rate of 0.5 gallons per minute with 18 megohm deionized water.

The air heads were supplied with house compressed air at 80 psi, this supply was reduced to 60 psi and was supplied through a manifold system to each of the four air heads. Each head was supplied by a standard ½ inch tube that was non-constricted to the head system. The tube supply described was for each top and bottom half of the heads, i.e., each head (air and water) had two ½ inch supplies, 1 on top and 1 on the bottom. The compressed air supply system also provided the air to the air knife barriers, each barrier supplied by a ⅛ inch tube (1 on top, 1 on bottom; on each end of each head, 4 in total). The air input was filtered with a 0.2 micron filter to assure cleanliness.

Each head included two rows of guides, each 36 mm wide to accomodate 36 mm ceramic substrates 0.60 inches thick. In each row the air barriers and injector holes extended the full width of the row. In each row, there were 22 holes evenly spaced across the width, with 1 row for each air barrier and 3 rows, for each injector head, positioned as described above. The hole diameters were 0.020 inches for all.

The comparative results of the two systems are as follows.

| DEBRIS | REMOVAL EFFECTIVENESS | |
|---|---|---|
| | VAC-BLOW SYSTEM | INVENTIVE SYSTEM |
| Larger than 0.003 Inch Loose | 65% | greater than 95% |
| Smaller than 0.003 Inch Loose | APPROX 0% | greater than 65% |
| ADHERED DEBRIS | APPROX 0% | greater than 50% |

As can be seen the removal effectiveness is significantly greater for the inventive system. The debris removal is undesirable for the process investigated, and removal of the debris immediately prior to the process is critical. The ability to use a cleaning liquid is key to the improved removal rate compared to prior cleaning limitation of gas (air). The inventive system has allowed for the use of a liquid in cleaning immediately prior to the process where it is critical. The features of the apparatus associated with the inventive system have allowed for the implementation of the cleaning system where previously gas (air) systems were only available.

We claim:

1. A method for fluid treating a substrate, comprising the steps of:

moving a substrate into and through a first channel of a first fluid treatment compartment;

treating said substrate with a first fluid, while producing a fluid bearing action on said substrate, during at least a portion of a time said substrate is in said first channel;

moving said substrate into and through a second channel of a second fluid treatment compartment positioned immediately adjacent said first fluid treatment compartment, said second channel being aligned with said first channel;

treating said substrate with a second fluid during at least a portion of a time said substrate is in said second channel; and preventing intermingling of said first and second fluids, wherein said substrate is a chip carder substrate and each of said first and second fluids is chosen from the group consisting of water, air, liquid chemical etchant and liquid electrolyte.

2. The method of claim 1, wherein said step of treating said substrate with said first fluid includes the steps of impinging at least a first row of at least two spaced-apart fluid jets of said first fluid upon said substrate and flowing more than half the first fluid associated with said first row of fluid jets in a direction which is substantially opposite to a direction of motion of said substrate through said first channel after said first row of fluid jets has been impinged upon said substrate.

3. The method of claim 1, wherein said step of treating said substrate with said second fluid includes the step of producing a fluid bearing action on said substrate during at least a portion of the time said substrate is in said second channel.

4. The method of claim 1, wherein said step of treating said substrate with said second fluid includes the steps of impinging at least a second row of at least two spaced-apart fluid jets of said second fluid upon said substrate and flowing more than half the second fluid associated with said second row of fluid jets in a direction which is substantially opposite to a direction of motion of said substrate through said second channel after said second row of fluid jets has been impinged upon said substrate.

5. The method of claim 1, wherein said preventing step includes the step of producing a third row of at least two spaced-apart fluid jets of a third fluid in said first channel adjacent an exit of said first channel, which is immediately adjacent said second channel.

6. The method of claim 1, wherein said step of moving said substrate into and through said first channel includes the step of guiding said substrate along a direction which is substantially parallel to a longitudinal axis of said first channel extending from an entrance to an exit of said first channel.

7. The method of claim 1, wherein said chip carrier substrate is a printed circuit board substrate.

8. The method of claim 1, wherein said chip carrier substrate is a ceramic substrate.

* * * * *